United States Patent [19]

Becker et al.

[11] Patent Number: 4,791,005
[45] Date of Patent: Dec. 13, 1988

[54] METHOD FOR THE MANUFACTURE OF SILICON OXIDE LAYERS DOPED WITH BORON AND PHOSPHORUS

[75] Inventors: Frank S. Becker, Munich; Dieter Pawlik, Groebenzell, both of Fed. Rep. of Germany

[73] Assignee: Siemens Aktiengesellschaft, Berlin and Munich, Fed. Rep. of Germany

[21] Appl. No.: 113,412

[22] Filed: Oct. 27, 1987

Related U.S. Application Data

[63] Continuation-in-part of Ser. No. 855,399, Apr. 24, 1986, abandoned.

[30] Foreign Application Priority Data

May 22, 1985 [DE] Fed. Rep. of Germany ....... 3518452

[51] Int. Cl.$^4$ .................. C23C 16/00; B05D 5/12; C03C 3/06
[52] U.S. Cl. .................. 427/255.3; 437/236; 437/240; 501/54
[58] Field of Search ............... 437/235, 236, 238, 240; 501/54, 63; 427/255.2, 255.3

[56] References Cited

U.S. PATENT DOCUMENTS

| 3,481,781 | 12/1969 | Kern | 117/215 |
|---|---|---|---|
| 3,571,914 | 3/1971 | Lands | 427/85 |
| 4,217,375 | 8/1980 | Adams | 427/85 |
| 4,324,576 | 4/1982 | Matsuyama et al. | 501/54 |
| 4,349,584 | 9/1982 | Flatley | 427/85 |
| 4,363,830 | 12/1982 | Itsu | 427/85 |
| 4,513,026 | 4/1985 | Miyamoto et al. | 437/240 |
| 4,546,016 | 10/1985 | Kern | 427/95 |
| 4,557,950 | 12/1985 | Foster | 427/85 |

FOREIGN PATENT DOCUMENTS

| 0141496 | 5/1985 | European Pat. Off. | 427/95 |
|---|---|---|---|
| 55-14138 | 4/1980 | Japan | 427/95 |

OTHER PUBLICATIONS

Winkle et al., "Improved Atmospheric-Pressure CVD System for ... Phosphosilicate Glass Thin Films", Solid State Technology, vol. 24, No. 10, Oct. 1981, pp. 123–128.
Article by Kern et al. in RCA Review, vol. 43, Sep. 1982, pp. 423–457.
Article by Smolinsky et al. "Measurements of Temperature Dependent Stress of Silicon Oxide", J. Electrochem. Soc., Apr. 1985, pp. 950–954, vol. 132-4.

Primary Examiner—Norman Morgenstern
Assistant Examiner—Marianne L. Padgett
Attorney, Agent, or Firm—Hill, Van Santen, Steadman & Simpson

[57] ABSTRACT

A method for the manufacture of silicon layers containing boron and phosphorus dopants wherein the silicon wafers are positioned in a reaction chamber into which there is introduced, from separate sources, (a) tetraethylorthosilicate as a source of silicon dioxide, (b) trimethylborate as a source of boron, and (c) a phosphorus source. The three reactants are decomposed in the reaction chamber to deposit silicon dioxide doped with boron and phosphorus onto the wafers, the decomposition being carried out at a temperature of at least 600° C. and at a substantially subatmospheric pressure.

8 Claims, 1 Drawing Sheet

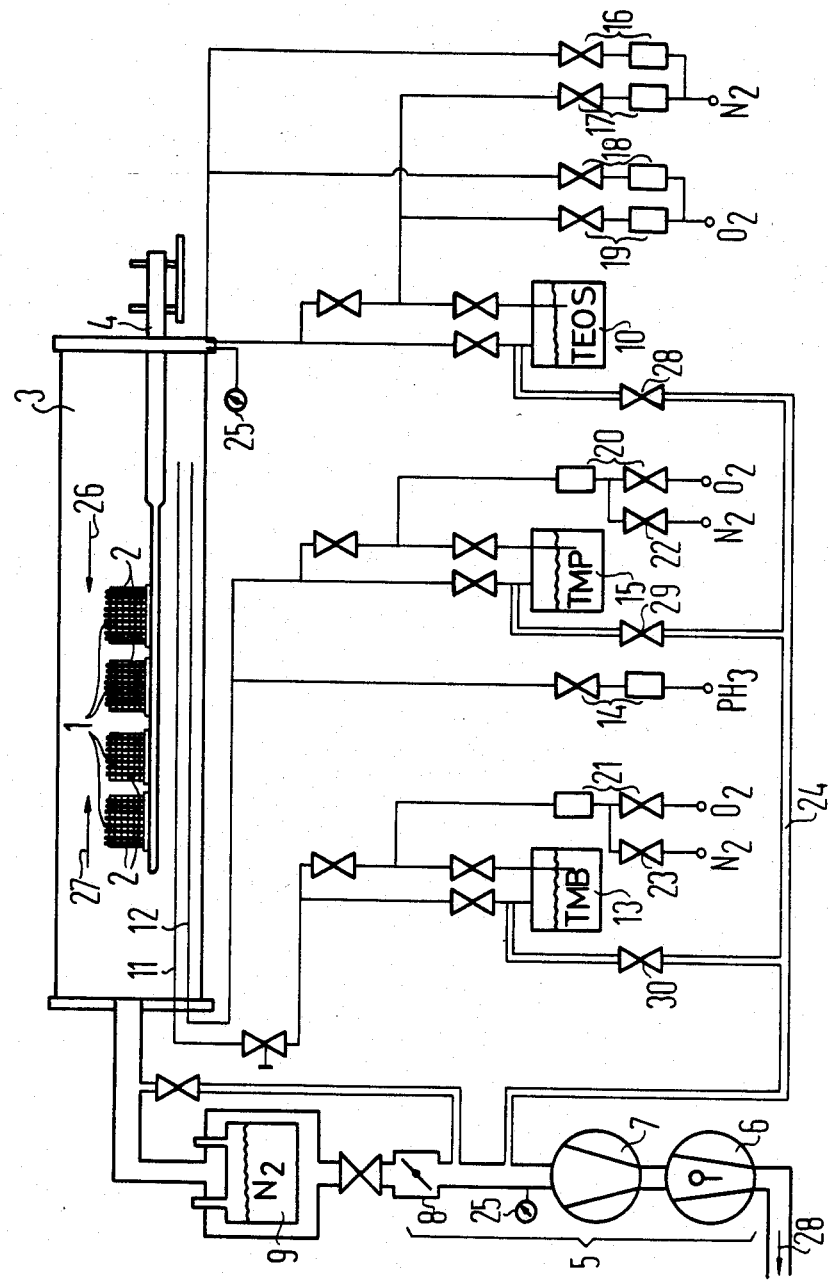

METHOD FOR THE MANUFACTURE OF SILICON OXIDE LAYERS DOPED WITH BORON AND PHOSPHORUS

This is a continuation-in-part of application Ser. No. 855,399, filed Apr. 24, 1986.

BACKGROUND OF THE INVENTION

1. Field of the Invention

The present invention is in the field of manufacturing boron and phosphorus doped silicon dioxide layers which are employed in the manufacture of integrated semiconductor circuits, as intermediate layers for electrical insulation and for the compensation of topographical irregularities on substrate wafers.

2. Description of the Prior Art

Boron and phosphorus doped silicon oxide layers are referred to as boron-phosphorus-silicate glass (BPSG) layers and are manufactured by oxidizing silane in the temperature range between 300° and 450° C. To generate the oxide doping, phosphine ($PH_3$) and diborane ($B_2H_6$) or boron trichloride ($BCl_3$) are simultaneously added. The process can be carried out both in a plasma arc at atmospheric pressure or at a reduced pressure.

Deposition methods for use at atmospheric pressure and in the aforementioned temperature range using phosphine and borane as doping gases are described, for example, in U.S. Pat. No. 3,481,781 to Kern and in an article by Kern et al in the RCA Review, Vol. 43, September 1982, pages 423 to 457.

In their application as intermediate oxide layers between polysilicon levels and an aluminum interconnect level, the boron-phosphorus-silicate glass layers must meet the following conditions for the manufacture of VLSI MOS memories:

1. The intermediate oxide must guarantee good electrical insulation between the polysilicon level or the diffusion regions and the aluminum interconnect level.

2. The intermediate oxide level must level off or round off the topographical irregularities on the substrate which arise during the polysilicon structuring. Such a rounding off is necessary since the subsequent aluminum sputtering process exhibits shadowing effects and could effect excessively pronounced steps in the substrate, overhanging portions, or contouring of the aluminum interconnects. This problem becomes more critical with increasing integration of components since as the lateral dimensions decrease with unchanged layer thicknesses, the height/breadth aspect ratio increases.

Since only an edge covering which does not exhibit additional overhangs can be achieved by means of optimizing the oxide deposition process utilizing chemical vapor deposition (CVD), it is necessary to use an intermediate oxide process which is a combination of layer deposition and subsequent "flowing". In order to carry out such a flowing step at temperatures which are realistic in terms of process engineering, the $SiO_2$ must contain additives which reduce its softening point. In practice, phosphorus or boron and phosphorus are employed for this purpose, these materials being incorporated into the intermediate oxide layer during the layer deposition in the form of their oxides and forming what are known as "ternary" phases. The phosphorus has the primary function of improving the electrical stability of the layer and the boron content controls the flow temperature.

The processes mentioned above from the prior art for the manufacture of boron-phosphorus-silicate glass layers have various disadvantages.

1. As a source of boron, diborane is toxic, explosive and chemically unstable. The diborane content of a gas bottle containing the diborane gas mixture decreases in time and so no traditional low pressure gaseous phase deposition utilizing tube systems with injectors can be employed since the diborane heats and decomposes in the injectors. Boron trichloride, on the other hand, may lead to an incorporation of chlorine in the layer, causing serious corrosion problems of the subsequent metallization layers which are applied.

2. The chemical stability in the presence of atmospheric humidity is generally poor with the doped low temperature oxides. For example, boric acid crystals may occur when the boron content is in the range from 3 to 4 weight percent, as disclosed in the initially cited report by Kern and Schnable from the "RCA Review", Vol. 43, 1982, pages 423 through 457.

3. The phosphorus in the low temperature layers is partly present as $P_2O_3$ and partly as $P_2O_5$, whereas only the pentavalent phosphorus is responsible for the flowing properties.

4. Oxide processes based on silane are very sensitive to leaks in the deposition system.

5. The edge coverage of the low temperature oxides is generally unsatisfactory.

SUMMARY OF THE INVENTION

The present invention provides a boron-phosphorus-silicate glass deposition process which avoids the disadvantages of processes used in the prior art. Specifically, the present invention involves the use of the compounds tetraethylorthosilicate (($C_2H_5O)_4Si$) as the $SiO_2$ source, trimethylborate (($CH_3O)_3B$) as the boron source and trimethylphosphate (($CH_3O)_3PO$) as the initial materials for thermal decomposition. The decomposition of the compounds is simultaneously carried out at temperatures of at least 600° C. in a low pressure reactor. The third provision is that the starting materials are supplied to the reactor by means of separate sources.

Instead of trimethylphosphate, phosphine ($PH_3$) mixed with oxygen ($O_2$) can be employed, provided the $PH_3/O_2$ ratio is greater than 0.2. These gases may be supplied to the reactor by means of a flow rate regulator.

The pressure in the reactor is preferably set to the range between 15 to 100 Pa. The temperature in the reactor is preferably set to 600° to 700° C. The tetraethylorthosilicate and the trimethylborate are introduced into the reaction zone at a temperature of 30° to 60° C., while the trimethylphosphate is introduced at a temperature greater than 60° C.

In a further embodiment of the invention, carrier gases such as nitrogen or oxygen are employed to convey the compounds to be evaporated, the carrier gases being conducted through the evaporator vessels. Finally, the combination of the boron and phosporus sources are conveyed in opposite directions from the tetraorthosilicate compound in the reaction zone.

BRIEF DESCRIPTION OF THE DRAWINGS

The invention shall be set forth in greater detail with reference to an exemplary embodiment, and the single FIGURE constituting the drawing. This FIGURE shows a cross section of an apparatus in which the semiconductor substrate wafers composed of silicon are provided with a boron-phosphorus-silicate glass layer.

DESCRIPTION OF THE PREFERRED EMBODIMENTS

In the FIGURE, silicon wafers 2 are shown supported on mounts 1 with suitable support means for holding the wafers in place, such mounts commonly being referred to as "boats". The wafers are introduced into a commercially available low pressure deposition furnace 3 by means of a reciprocating slide device 4. The reaction tube 3 is evacuated as illustrated by the arrow 27 from a pump stand 5 composed of a backing pump 6, a vacuum booster 7, and a control valve 8 and also including a nitrogen condensation trap 9. The process gases which are required for building up the boron-phosphorus-silicate glass layer to be applied to the substrate wafers 2 are then introduced.

The tetraethylorthosilicate (TEOS) is evaporated in an evaporator 10 which is at a temperature in the range from 30° to 60° C. The gas is admitted into the reactor at the side of the reactor 3 at which the substrate wafers 2 are also introduced, as indicated by the arrow 26. The doping gases, on the other hand, are introduced into the reaction chamber 3 from the opposite side as indicated by the arrow 27, the introduction being through injectors 11, 12 usually consisting of thin crystal tubes provided with nozzle type outlets.

The feed of the boron doping gas trimethylborate (TMB) occurs by means of the evaporator 13 which is held at a temperature in the range from 30° to 60° C. The phosphorus doping can be accomplished by means of phosphine gas ($PH_3$) by means of a flow rate meter 14 or by means of trimethylphosphate (TMP) from an evaporator 15 which is at a temperature above 60° C., preferably at 70° C. Either phosphorus source can suitably be used for the phosphorus doping.

The deposition pressure in the reaction chamber 3 is controlled to the range of from 100 to 800 mTorr, and the $PH_3/O_2$ ratio is at least 0.2. The deposition temperature range is selected from 600 through 700° C.

By means of additional connecting lines and flow regulators comprising valves 16, 17, 18, 19, 20 21, 22 and 23, it is possible to admit nitrogen ($N_2$) or oxygen ($O_2$) to bubble through the evaporators 10, 13 and 15. The evaporators 10, 13 and 15 are connected to the pump stand 5 by means of a vacuum line 24 and valves 28, 29 and 30. The pressure is monitored by means of measuring instruments generally indicated by reference numeral. Further elements not provided with reference characters in the drawing represent valves for the individual feed lines.

The use of trimethylphosphate in a low pressure chemical vapor deposition process in conjunction with tetraethylorthosilicate and trimethylborate makes it possible to generate doped $SiO_2$ layers which are completely and precisely controllable, and thus reproducible. The method of the present invention using trimethylphosphate as the phosphorus source can be carried out in a simple low pressure trap, and is easily controllable. In the present state of high integration of semiconductor circuits, for example, MOS memory components, this ability to reproduce a process exactly is decisive importance.

In the counter current method of the present invention wherein the doping gases flow in opposition to the tetraethylorthosilicate, a high level of uniformity of the deposited $SiO_2$ layers can be achieved over the entire batch.

A further advantages of the method according to the invention is that it makes possible high doping concentrations which are not simply dependent on the concentrations of the starting materials, that is, the quantitative proportions of the layer generating gases. The boron and phosphorus doped silicon oxide is a ternary phase of the three oxides $SiO_2$, $B_2O_3$, and $P_2O_5$. In order to achieve a chemically stable phase, i.e., one which is stable in contact with water and a physically or thermally stable phase, all parameters must be adjusted to one another in the generation of the layers. The concentrations of the doping materials which are achieved are thus also dependent on the specific values of pressure and temperature used in the deposition of the layer.

Generally speaking, the method will be carried out under conditions sufficient to produce a boron content of at least 5% by weight. When the method of the present invention is used for generating intermediate layers in MOS memory components, the best combination is that of 6% by weight boron and 3% by weight phosphorus in the layer. The high boron concentration of 6% by weight achieved by this method is necessary for the flow characteristics to be achieved, and such high concentration is not achieved, to our knowledge, in the prior art. Thus, only the method according to the present invention is suitable for generating an intermediate layer which can be rounded in a subsequent flow process and which also has the other necessary characteristics to appear between two metallization layers.

We claim as our invention:

1. A method for the manufacture of silicon oxide layers doped with boron and phosphorus which is stable in contact with water comprises:

providing a reaction chamber,
   positioning silicon wafers in said reaction chamber,
   introducing into said reaction chamber form separate sources, the reactants;
   (a) tetraethylorthosilicate
   (b) trimethylborate and
   (c) a phosphorus source consisting of trimethylphosphate and passing said trimethylphosphate and said trimethylborate in one direction through said reaction chamber and passing said tetraethylorthosilicate through said reaction chamber in the opposite direction, and
   decomposing said reactants in said reaction chamber to deposit silicon dioxide doped with boron and phosphorus onto said wafers, the decomposition being carried out at a temperature of at least 600° C. and at a substantially sub-atmospheric pressure, the resulting deposite containing at least 5% by weight boron.

2. A method according to claim 1 wherein said subatmospheric pressure is in the range from 15 to 100 Pa.

3. A method according to claim 1 wherein said temperature is in the range from 600° to 700° C.

4. A method according to claim 1 wherein the temperature of said tetraethylorthosilicate and said trimethylborate are in the rnage of 30° to 60° C. when introduced into said reaction chamber.

5. A method according to claim 4 wherein the temperature of said phosphorus source is more than 60° C. when introduced into said reaction chamber.

6. A method according to claim 1 wherein said reactants are introduced into said reaction chamber by means of a carrier gas.

7. A method according to claim 6 wherein said carrier gas is nitrogen.

8. A method according to claim 6 wherein said carrier gas is oxygen.

* * * * *